United States Patent [19]

Flaherty et al.

[11] 4,006,407
[45] Feb. 1, 1977

[54] NON-DESTRUCTIVE TESTING SYSTEMS HAVING AUTOMATIC BALANCE AND SAMPLE AND HOLD OPERATIONAL MODES

[75] Inventors: John J. Flaherty, Elk Grove Village; Eric J. Strauts, Chicago, both of Ill.

[73] Assignee: Magnaflux Corporation, Chicago, Ill.

[22] Filed: Mar. 10, 1975

[21] Appl. No.: 556,898

[52] U.S. Cl. .............................................. 324/40
[51] Int. Cl.² ...................................... G01R 33/12
[58] Field of Search ................... 324/37, 40, 41

[56] References Cited

UNITED STATES PATENTS

| | | | |
|---|---|---|---|
| 2,914,726 | 11/1959 | Harmon | 324/37 |
| 3,278,839 | 10/1966 | Wells et al. | 324/40 |
| 3,532,980 | 10/1970 | Tucker | 324/111 |
| 3,566,258 | 2/1971 | Mori et al. | 324/40 |
| 3,763,424 | 10/1973 | Bennett, Jr. | 324/41 |
| 3,794,915 | 2/1974 | Wolfinger | 324/130 |

FOREIGN PATENTS OR APPLICATIONS 1,925,354  12/1969  Germany ............................ 324/40

OTHER PUBLICATIONS

Doll et al.; Vehicle Mounted Mine Detector; Electronics; Jan. 1946; pp. 105–109.
Cohen et al.; Self Balancing System Etc.; IEEE Trans. on Bio–Medical Eng.; vol. BME–18; No. 1; Jan. 1971; pp. 66–69.

Primary Examiner—Robert J. Corcoran
Attorney, Agent, or Firm—Brezina & Lund

[57] ABSTRACT

Automatic balancing circuits are provided for non-destructive testing systems such as eddy current systems in which an unbalance of a probe circuit including a test coil produces undesired deviations from a null indication. Error signal components are generated from a probe circuit output signal, stored in storage means and then applied in a balancing direction to cancel the effect of the unbalance of the probe circuit. Preferably, the error signal components are generated by a pair of quadrature phase detectors and the storage means comprises either a capacitor or the combination of digital storage and digital-analog converter means. The balancing is performed either automatically, with a delay in the storage operation, or by operation of a switch means between a sample or null condition in which the error signals are stored and a hold condition in which the stored error signals are applied. In one embodiment, the stored error signals are used to modulate AC signal components in quadrature phase relation which are applied in a balancing direction. In another, the stored error signals are developed from phase detector output signals and then combined therewith. In both embodiments, balancing signals are combined with signals derived from the probe circuit output signal and applied at points preceding high gain amplification in signal processing circuitry.

10 Claims, 5 Drawing Figures

NON-DESTRUCTIVE TESTING SYSTEMS HAVING AUTOMATIC BALANCE AND SAMPLE AND HOLD OPERATIONAL MODES

This invention relates to automatic balancing circuits for non-destructive testing systems and more particularly to automatic balancing circuits which are comparatively simple in construction and operation and readily applied to a variety of testing systems and testing conditions to obtain fast and highly accurate testing.

BACKGROUND OF THE INVENTION

In a number of non-destructing systems, balancing is necessary to obtain accurate indications and measurements, the desired balance being usually established when a null indication is obtained in a particular condition of probe means relative to a part. For example, in eddy current systems in which a test coil is in one leg of a bridge circuit or in which a test coil and a reference coil are inductively coupled to a primary winding and connected to develop a differential output signal, it may be desired to obtain a null indication when the test coil is placed against or in predetermined relation to a reference part of known characteristics, or when the test coil and a reference coil are in the same relationship to two parts or two portions of the same part which have the same characteristics. To obtain a balance, it has been the practice to provide manually adjustable impedances and/or arrangements using manually adjustable phase shifters for injecting an AC signal of the proper magnitude and phase. The adjustment of such systems has been difficult and time-consuming and frequent readjustment is oftentimes necessary to offset drift from heat, conductivity changes, permeability changes, etc.

Arrangements have heretofore been proposed for automatic balancing of such systems, using servo motors for adjustment of potentiometers. An electronic circuit arrangement is proposed in the Mori et al. U.S. Pat. No. 3,566,258 using synchronous rectifier circuits coupled to the output of a bridge circuit and to an AC source with supplementary AC signals being supplied to a variable gain amplifier connected to the outputs of the synchronous rectifier circuits. The operation is not entirely clear but it appears that, if operable at all, the system would be limited to the detection of rapid changes, such as produced by movement of the test coil over flaws, the outputs of the rectifier circuits being applied directly to the variable gain amplifier circuits. One mention is made as to limiting the response speed as to a first rectifier and reducing the time constant of the second, but such would not be very satisfactory in many applications. For example, it is oftentimes desirable when testing with respect to characteristics other than flaws, such as changes in permeability or conductivity in which the response time is generally slow, to obtain a balance only when a test coil or probe is in a predetermined relationship to a part of known characteristics. In such cases, continuous and rapid automatic balancing would not permit accurate testing. The Mori et al. patent system also requires a substantial number of phase shifters and, more important, is limited to the use of a bridge circuit to which the signals are applied.

SUMMARY OF THE INVENTION

This invention was evolved with the general object of providing automatic balance circuits which can be easily applied to various testing systems, which are comparatively simple in operation and highly reliable and which permit rapid and highly accurate testing in a variety of testing conditions.

In accordance with this invention, error signal generator means are provided responsive to off-balance signal components of a probe circuit output signal to develop error signal components and signal storage means are provided responsive to such error signal components with the stored signal components being applied in a balancing direction to cancel the effect of the off-balance components of the probe circuit output signal. In one mode of operation, delay means are provided for developing the error signal components in the storage means with a time delay of substantial duration such as to effect automatic balance to a predetermined null condition in response to slow changes in the probe circuit output signal while producing indications in response to rapid changes in the probe circuit output signal. In another mode of operation, hold switch means are operable between a sample or null condition in which the error signal components are applied to the storage means and a hold condition in which the error signal components stored during the sample or null condition are applied in a balancing direction.

In either mode of operation, the storage of the error signal components permits balancing to a null condition in a selected condition of the probe circuit. For example, in testing for cracks with an eddy current instrument, the first mode of operation can be used with a probe coil being held in a stationary position against or around a part to effect an automatic null after the delay time provided by the delay means and thereafter with relative movement of the part and the probe coil, the changes in the probe circuit output signal such as produced by cracks will be indicated. In the second mode of operation, the automatic balancing can be performed on demand by operation of the hold switch means to the sample or null condition in a selected condition of the probe means, with the hold switch means being then operated back to the hold condition for testing. The hold switch means can be operated manually or periodically and may also be operated in response to prescribed conditions. For example, in a bar testing system in which bars are moved longitudinally through a test coil assembly, end suppression means are generally provided for sensing the end of the bar and deactivating the indicating means. In such a system, the hold switch means may be operated from such end suppression means to store the error signals when there is no metal in the coil assemblies.

The storage means may comprise capacitor means connected to high input impedance amplifier means for application of the error signals for balancing, the high input impedance of the amplifier means serving to prevent rapid discharge of the capacitor means. For the automatic mode of operation, the capacitor means may be charged through impedance means having a resistance sufficiently high to achieve a delay of at least a few seconds. For the sample and hold mode of operation, the capacitor means may be rapidly charged in the sample condition but the imput impedance of the amplifier means connected thereto should be very high, to store the error signal components for a time period of on the order of at least one minute and preferably much longer.

According to an important feature, the storage means may comprise digital storage means and digital-analog converter means for converting analog signal components into digital signal components for storage and for converting stored digital signal components back into analog signal components for balancing. According to a specific feature, the digital storage means includes a reversible digital counter, high frequency clock means coupled to the digital counter in the sample condition of the hold switch and signal comparison means responsive to the error signal components and to the analog output of the converter means to cause the counter means to count in an increasing direction with the magnitude of the error signal components is greater than the analog output of the converter means and in a decreasing direction when the magnitude of the error signal components is less than the analog output of the converter means.

With such digital storage means, the error signal components can be stored indefinitely and this feature is highly advantageous in many applications. In instruments for measuring conductivity, for example, the error signal components can be sampled and stored when a probe is placed in proximity to a reference part having a known conductivity and thereafter, the instrument may be used to perform accurate measurements for a long period of time, requiring rebalancing only after long periods of operation in which slight drifts may occur.

The balancing circuitry of the invention may be applied to a number of different types of non-destructive testing systems, including eddy current systems having either a bridge or a balanced coil array. A specific feature of the invention is that the balancing is performed by applying the stored error signal components in signal processing means having input means coupled to a probe circuit to respond to output signals therefrom and having output means coupled to indicating means, preferably with the error signal components and signal components derived from the probe circuit output signal being combined to develop composite signal components which are applied to input means of high gain amplifier means in the signal processing circuitry. With this arrangement, the circuitry can be used with a variety of types of probe circuits but the error signal components are applied at a relatively low level which is found to be highly advantageous in achieving accurate balance.

For systems in which the probe circuit output signal is in the form of an AC signal having a phase and amplitude varying according to characteristics of the part under test, the error signal components may be generated by a pair of phase detectors responsive to the AC output signal of the probe circuit and to reference AC signals in quadrature phase relation, to produce quadrature signal components forming the error signal components. In one type of system, the ouput signals of the phase detectors, after storage, are applied to modulator means to develop a pair of AC signal components which are applied for balancing. In another type of system, the error signal storage means comprises a pair of storage capacitors coupled in series between the phase detectors and inputs of DC amplifier means the outputs of which are coupled to the indicating means. This provides a very simple and yet highly effective and accurate system, with automatic balance.

Further features of the invention relate to specific circuit arrangements and to switching arrangements for selecting a mode of operation best suited to a particular application.

This invention contemplates other objects, features and advantages which will become more fully apparent from the following detailed description taken in conjunction with the accompanying drawings.

DESCRIPTION OF PREFERRED EMBODIMENTS

Figure 1:
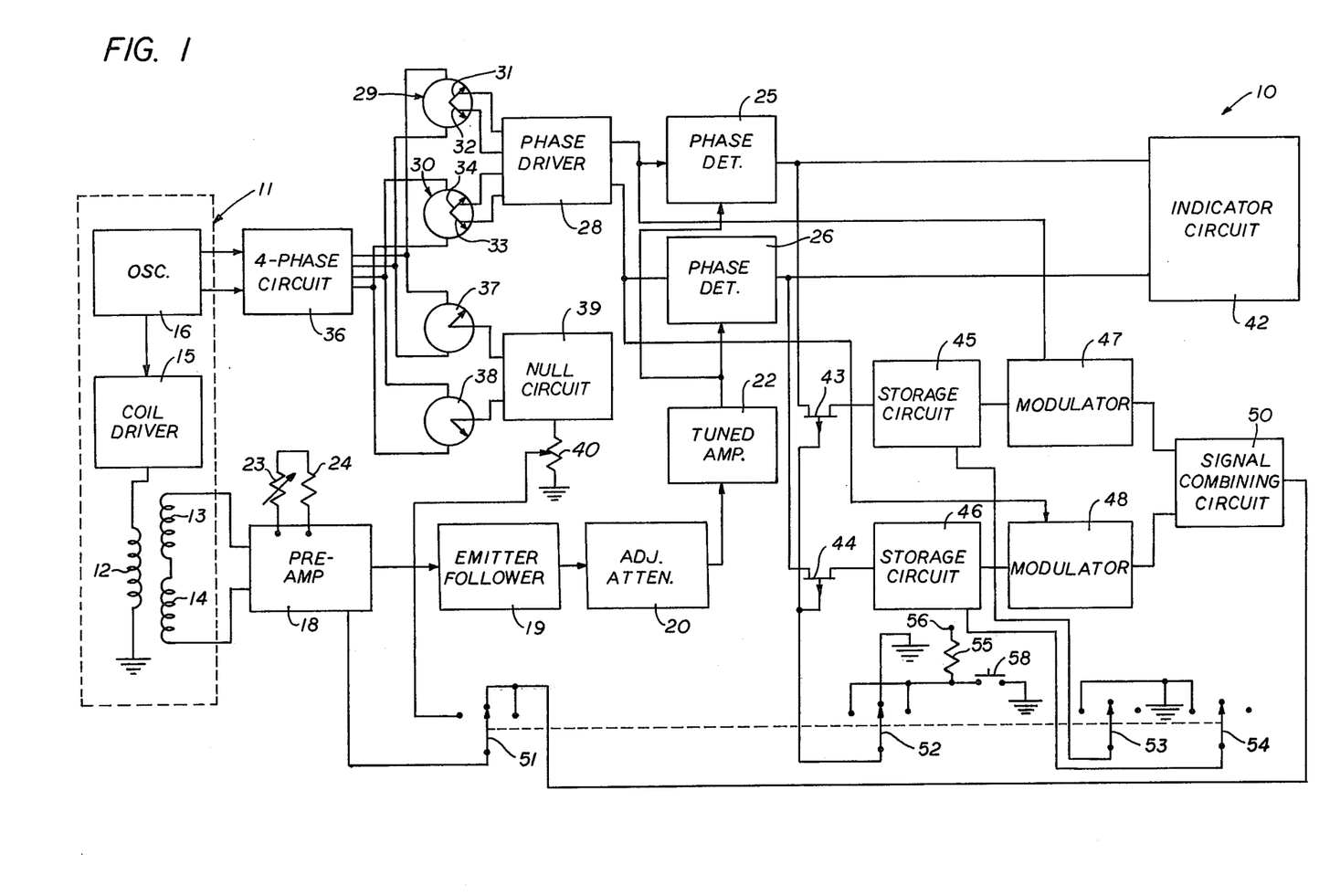
FIG. 1 is a schematic block diagram of an eddy current testing system incorporating balancing circuits according to the invention.

Referring to FIG. 1, reference numeral 10 generally designates an eddy current testing system incorporating balancing circuits constructed in accordance with the principles of the invention. The illustrated system comprises a probe circuit 11 which includes a primary coil 12 and a pair of differentially connected secondary coils 13 and 14. By way of example, the coils may be arranged for longitudinal passage of pipe or tubing to be inspected axially therethrough. The primary coil 12 may be an axially elongated coil and the secondary coils 13 and 14, located in a central position relative to the elongated primary coil, may be of short axial length and spaced a certain axial distance apart. As the pipe or tubing is passed through the coils, a flaw passing through the coil 13 may either increase or decrease the output thereof and then, as it passes through the coil 14, may either increase or decrease the output thereof, the result being that a net output of one phase is produced as the flaw passes through the coil 13 and a net output of the opposite phase is produced as the flaw passes through the coil 14.

The exact phase relation of the signal so obtained is affected by the type of flaw, its configuration and orientation, depth, etc. Changes in the diameter of the tubing, changes in wall thickness, changes in permeability and other variations generally produce different responses with respect to amplitude and phase. In most test operations, it is desirable to be able to discriminate between the responses produced from various causes. For example, it is oftentimes desirable to detect axially extending cracks which might render the tubing unsuitable for its intended use, whereas variations in diameter, wall thickness, permeability and the like, if kept within limits may be relatively unimportant.

In systems of this type, as well as in other non-destructive testing systems of a similar character, it is desirable to obtain a null indication when the test probe is placed against or in predetermined relation to a reference part of known characteristics or when the test probe and a reference probe are in the same relationship to parts or to portions of the same part which have the same characteristics. This invention provides balancing circuits for obtaining the proper balance and facilitating fast and highly accurate testing.

To excite the primary winding 12, the probe circuit 11 includes a coil driver stage 15 having an output connected to the coil 12 and having an input connected to the output of an oscillator 16 which may be a fixed frequency oscillator or an oscillator having a frequency which is variable, or adjustable in steps, over a range of frequencies. The differentially connected secondary coils 13 and 14 are connected to a pre-amplifier 18 having an output coupled through an emitter-follower stage 19 and an adjustable attenuator 20 to a tuned amplifier 22 having a high gain. The attenuator 20, which may be adjustable in steps, forms a "coarse" sensitivity control and a "fine" sensitivity control is formed by an adjustable resistor 23 connected in series with a fixed resistor 24 to the pre-amplifier 18.

The output of the tuned amplifier 22 is supplied to a pair of phase detectors 25 and 26 having inputs connected to a phase driver circuit 28. The phase driver circuit 28 has inputs connected to ganged sine and cosine potentiometers 29 and 30, one pair of inputs being connected to movable contacts 31 and 32 of one potentiometer 29 and another pair of inputs being connected to movable contacts 33 and 34 of potentiometer 30. In-phase and 90° phase signals are applied from the oscillator 16 to a four phase circuit 36 which supplies signals in 0° and 180° relation to the sine potentiometer 29 and signals in 90° and 270° phase relationship to the cosine potentiometer 30. In operation, signals applied to the phase detectors 25 and 26 are in quadrature phase relationship at all times and of uniform amplitude but the ganged potentiometers 29 and 30 may be rotated to adjust the phase of such signals to obtain any desired phase relationship to the exciting signal applied from oscillator 16 through the driver stage 15 to the primary coil 12. The phase detectors 25 and 26 produce signals proportional to the quadrature components of the AC signal produced from the coils 13 and 14 at the output of the probe circuit 11 and applied to the phase detectors 25 and 26 through the circuits 18–20 and 22.

The illustrated system incorporates manual means for adjustment of balance, compensating for differences in the characteristics of the secondary coils 13 and 14 in the illustrated system. In particular a sine potentiometer 37 is connnected to the 0° and 180° outputs of the circuit 36 and a cosine potentiometer 38 is connected to the 90° and 270° outputs of the circuit 36, contacts of the potentiometers 37 and 38 being connected through a null circuit 39 to a potentiometer 40 which has a movable contact connectable to the pre-amplifier 18. When so connected, the potentiometers 37, 38 and 40 may be adjusted to obtain a null output when the portions of the part under the coils 13 and 14 have the same characteristics. However, obtaining a balance manually is generally a difficult and time-consuming operation and in many cases, balancing must be performed at frequent intervals to compensate for drifts due to heat, conductivity changes, permeability changes, etc., and the balancing circuits of this invention as hereinafter described are provided for obviating such difficulties.

In the illustrated system, the outputs of the phase detectors 25 and 26 are applied to an indicating circuit 42 which may, for example, include an oscilloscope monitor for producing a flying spot indication. Reference is made to our prior U.S. Pat. No. 3,825,820 issued July 23, 1974 for a disclosure of a system including a flying spot scanner. It is noted, however, that other forms of indicating means may be employed and the indicating circuit may be connected directly to the output of the tuned amplifier 22. The adjustable phase shifters 29 and 30 may not be required, depending upon the type of indicating system which is used.

In the illustrated system, output signals from the phase detectors 25 and 26 are applied through a pair of field-effect transistors 43 and 44, operative as switches, to a pair of storage circuits 45 and 46, the outputs of the storage circuits 45 and 46 being connected to inputs of a pair of modulator circuits 47 and 48 which are connected to outputs of the phase driver circuit 28. Output signals of the modulator circuits 47 and 48 are combined in a signal combining circuit 50 to develop a signal which may be applied to the pre-amplifier 18 instead of the signal developed by the manual null adjustment as above described.

The system has three different modes of operation, a manual mode, a continuous-delay mode and a sample and hold mode, and a selector switch is provided having ganged contacts 51, 52, 53 and 54 for selecting the desired mode. In the manual position of contact 51, it connects the pre-amplifier 18 to the movable contact of potentiometer 40, while in the continuous-delay position and in the sample and hold position, contact 51 connects the input of pre-amplifier 18 to the output of the signal combining circuit 50.

Contact 52 in the manual position connects the emitters of the field-effect transistors 43 and 44 through a resistor 55 to a positive power supply terminal 56 to apply a positive voltage such as to prevent conduction of the transistors 43 and 44 and supply of signals to the storage circuits 45 and 46. In the continuous-delay position, switch contact 52 is connected to ground to cause conduction of the transistors 43 and 44 and application of signals to the storage circuits 45 and 46. In the sample and hold position, contact 52 is again connected through resistor 55 to power supply terminal 56 but it may be grounded by depressing a push button 58 to cause conduction of the transistors 43 and 44. Switch contacts 53 and 54 operate to ground certain circuit points of the storage circuits 45 and 46 to prevent operation thereof in the manual position while permitting operation thereof in the continuous-delay position and the sample and hold position.

In the continuous-delay mode of operation, the outputs of the phase detectors 25 and 26 provide error signals, proportional to the deviation of quadrature phases of the output of the tuned amplifier 22 from the desired null condition and such signals are applied through delay means in the storage circuits 45 and 46 to storage means therein. The error signals so stored are applied to the modulators 47 and 48 to control the amplitudes of quadrature phase signals applied thereto from the output of the phase driver circuit 28. Such quadrature phase signals developed at the outputs of the modulators 47 and 48 are combined by the circuit 50 and applied through the switch contact 51 to the pre-amplifier 18 in phase opposition to the signal which produced the error signals at the outputs of the phase detectors 25 and 26. Thus, with a part in a stable position and condition relative to the coils 12–14, a null indication is produced. However, the storage circuits 45 and 46, due to the delay means therein, cannot respond to sudden changes in the output of the probe circuit and indications away from the null indication may be produced by relatively rapid changes, such as produced by flaws in tubing being inspected. Accordingly, the system continuously adjusts automatically to the null condition but will respond to sudden changes in the probe output signal.

In the sample and hold position of the selector switch, the push button 58 may be depressed to a sample or null condition to apply error signals from the phase detectors 25 and 26 to the storage circuits 45 and 46 and produce a null indication in the manner as above described. However, when the push button switch 58 is opened, the error signals stored in the storage circuits 45 and 46 are retained for a long interval of time to maintain the balance produced on closure of the sample switch 58. Preferably, the signals are stored for a time interval at least on the order of 1 minute and preferably substantially longer. This mode of operation may be used when testing for characteristics which vary relatively slowly, such as permeability and conductivity changes, dimensional changes or the like. It may also, of course, be used for the detection of flaws.

Figure 2:
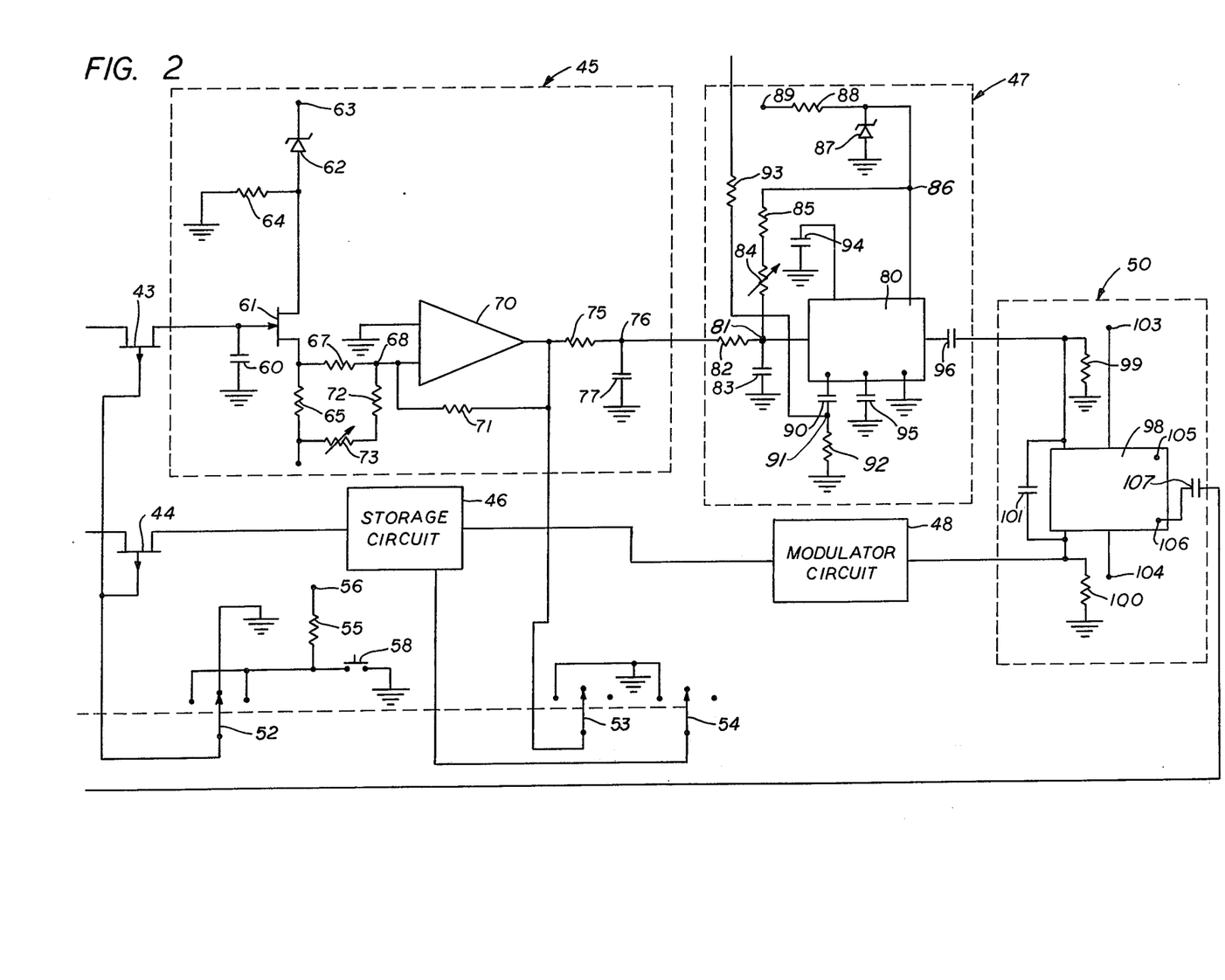
FIG. 2 is a circuit diagram of storage, modulator and signal combining circuits of the system of FIG. 1.

Referring to FIG. 2, the storage circuit 45 comprises a first storage capacitor 60 having one terminal connected to ground and its other terminal connected to the switching transistor 43 and also to an input terminal of a field-effect transistor 61. One output terminal of the transistor 61 is connected through a Zener diode 62 to a positive power supply terminal 63 and also through a resistor 64 to ground. The other output terminal of transistor 61 is connected through a resistor 65 to a negative power supply terminal 66 and also through a resistor 67 to a circuit point 68 which is connected to one input terminal of an operational amplifier 70, through a resistor 71 to the output terminal of amplifier 70 and through a fixed resistor 72 and an adjustable resistor 73 to the negative power supply terminal 66. The output of the operational amplifier 70 is connected through a resistor 75 to a circuit point 76 which is connected through a second storage capacitor 77 to ground. Circuit point 76 forms an output terminal of the storage circuit 45.

In operation, when the mode selector switch is in the continuous-delay position, the transistor 43 is conductive to supply a DC voltage across capacitor 60 and to the input of the field-effect transistor 61 proportional to the amplitude of the component of the signal applied from the tuned amplifier 22 to the phase detector 25 which is in phase with the signal applied from the phase driver circuit 28 to the phase detector 25. The operational amplifier 70 develops a corresponding signal at its output which charges the second storage capacitor 77 through the resistor 75 with a time delay which is dependent upon the values of the resistor 75 and capacitor 77. By way of example, the resistor 75 may have a value of 500 ohms while the capacitor 77 may have a value of 100 microfarads. The product of the resistance and capacitance in this case is 50 milliseconds and the time required for the capacitor 77 to become nearly fully charged is about 4 times as long, or about 0.2 seconds. The delay so provided is sufficient to allow continuous balancing to the null condition when the relative movement of the probe and part is relatively slow with the part having uniform characteristics. However, the delay is such that when there is a sudden change in the signal such as produced by movement over a crack or similar flaw in the part, an indication away from the null indication will be produced.

In the sample and hold mode of operation, the signal is applied from the phase detector 25 through the switching transistor 43 only when the push button switch 58 is closed and the first storage capacitor 60 is charged accordingly. When the switch 58 is opened, the capacitor 60 remains charged indefinitely, being connected only to the transistors 43 and 61 both of which provide impedances of on the order of hundreds of megohms. Capacitor 60 may have a value of 0.47 microfarads, for example, and the charge voltage is maintained thereacross for a time interval of at least on the order of one minute and preferably substantially longer.

With the capacitor 60 so charged, a corresponding output voltage is developed at terminal 76 which, through the modulator circuit 47, applies a corresponding signal component in the balancing direction. Thus, in the sample and hold mode of operation, the switch 58 may be closed with the probe in a selected condition relative to a part to obtain a null indication and after opening the switch 58, any deviations from such conditions will be indicated.

The adjustable resistor 73 provides a null offset adjustment and it and a corresponding resistor of the circuit 46 may be adjusted to obtain a null indication when the input voltages are 0. It should be understood that the storage circuit 46 is substantially identical to the circuit 45.

It is also noted that in the manual position of the mode selector switch, the output of the operational amplifier 70 is connected to ground through the contact 53 and the output of a corresponding amplifier of the storage circuit 46 is then connected to ground through the contact 54.

The modulator circuit 47 comprises an integrated circuit 80 having a first input terminal connected to a circuit point 81 which is connected through a resistor 82 to the circuit point 76, through a capacitor 83 to ground and through an adjustable resistor 84 and a fixed resistor 85 to a circuit point 86 which is connected through a Zener diode 87 to ground and through a resistor 88 to a positive power supply terminal 89, circuit point 86 being also connected to a power supply input terminal of the integrated circuit 80. A second input of the circuit 80 is connected through a capacitor 90 to a circuit point 91 which is connected through a resistor 92 to ground and to a resistor 93 to the output of the phase driver circuit 28 which is connected to the input of the phase detector 25. Additional terminals of the circuit 80 are connected through capacitors 94 and 95 to ground and directly to ground. An output terminal of circuit 80 is connected through a capacitor 96 to the signal combining circuit 50. The circuit 80, which may be a type SG 2402, for example, amplifies the AC signal applied from the phase driver circuit 28 in proportion to the magnitude of the DC signal applied from the output of the storage circuit 45 at the circuit point 76. Resistor 84 is an offset adjustment resistor and may, for example, be adjusted to obtain null output from the circuit 80 when the circuit point 76 is at ground potential.

The signal combining circuit 50 comprises an integrated circuit 98 having input terminals connected to the outputs of the modulator circuits 47 and 48, such input terminals being connected to ground through resistors 99 and 100 and being connected together through a capacitor 101. Additional terminals are connected to positive and negative power supply terminals 103 and 104. The circuit 98 has two output terminals 105 and 106 providing signals of opposite phase. As shown, the terminal 106 is connected to a capacitor 107 through an input of the pre-amplifier 18 in the continuous-delay and sample and hold positions of the switch contact 51. If the phase relations are not correct, producing regenerative feedback, the output can be taken from the terminal 105.

Figures 3, 4:
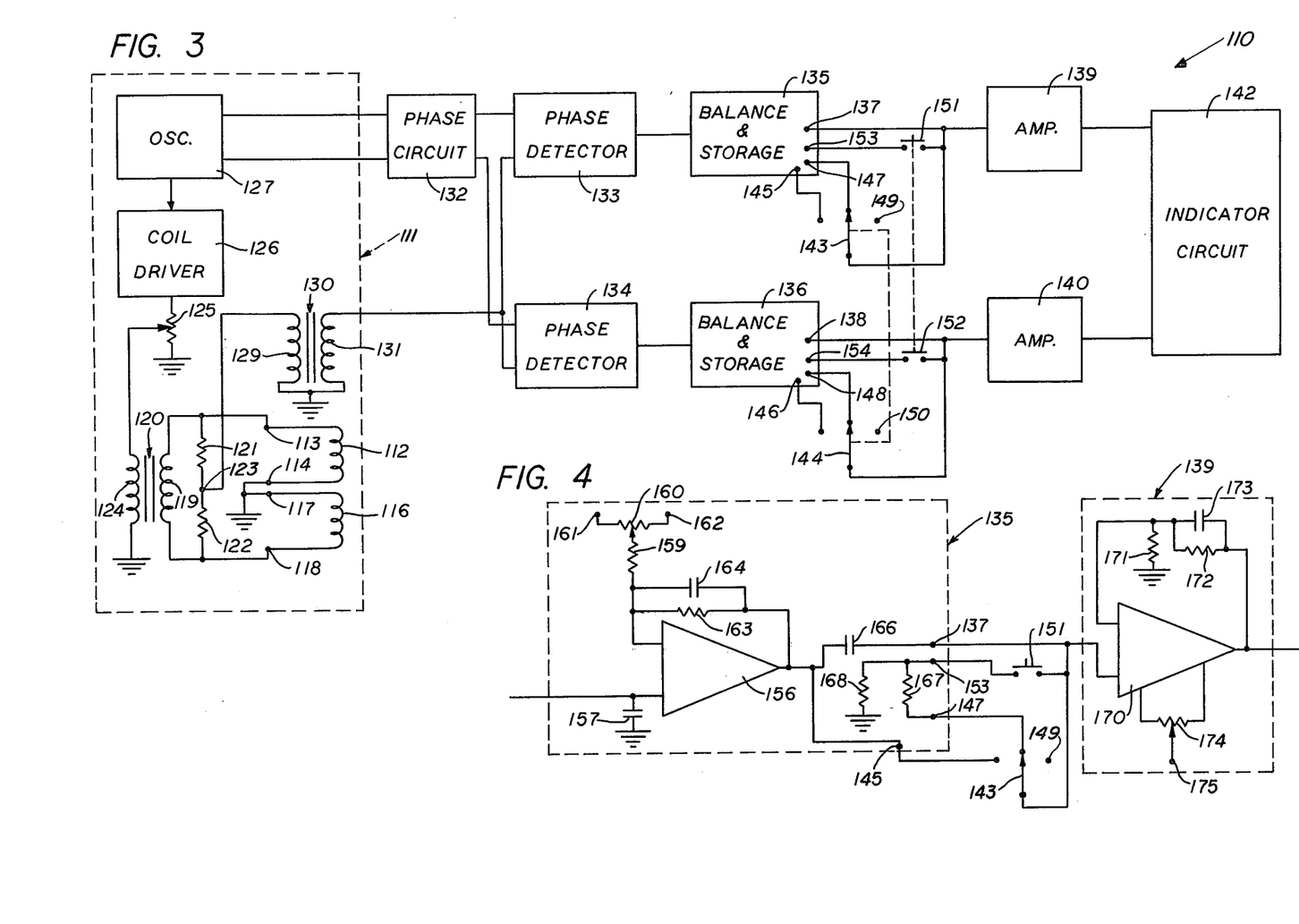
FIG. 3 is a schematic block diagram of another form of eddy current testing system incorporating balancing circuits according to the invention.
FIG. 4 is a circuit diagram of balancing and storage and amplifier circuits of the system of FIG. 3.

Referring to FIG. 3, reference numeral 110 generally designates another form of instrument including a probe circuit 111 in which a probe coil 112 may be connected to terminals 113 and 114 while a reference coil 116 may be connected to terminals 117 and 118. Terminals 114 and 117 are connected to ground while terminals 113 and 118 are connected to a secondary winding 119 of a transformer 120, terminals 113 and 118 being also connected through resistors 121 and 122 to a circuit point 123 forming a bridge output terminal. The transformer 120 has a primary winding 124 connected between ground and the movable contact of a potentiometer 125 connected between ground and the output of a coil driver circuit 126 connected to the output of an oscillator 127.

In the probe circuit 112, an AC voltage is supplied from the secondary winding 119 of the transformer 120 to a bridge defined by coils 112 and 116 and resistors 121 and 122, an AC output signal being developed at circuit point 123 which has a phase and magnitude dependent upon the relationship of the impedances of the coils 112 and 116. The output signal at circuit point 123 is applied to the primary winding 129 of a coupling transformer 130 having a secondary winding 131 connected to inputs of a pair of phase detectors 133 and 134 which have additional inputs connected to outputs of the phase circuit 132 connected to the oscillator 127, the phase circuit 132 being operative to supply AC signals to the phase detector circuits 133 and 134 in quadrature phase relation.

The phase detectors 133 and 134 develop signal components corresponding to the amplitudes of the quadrature phase components of the AC output signal of the probe circuit 111.

The output signals of the phase detectors 133 and 134 are applied to a pair of balance and storage circuits 135 and 136 having output terminals 137 and 138 connected to input terminals of a pair of amplifiers 139 and 140, the outputs of amplifiers 139 and 140 being connected to an indicating circuit 142.

A mode selector switch is provided including two ganged contacts 143 and 144 connected to the output terminals 137 and 138 of the balance and storage circuits 135 and 136. In a manual position, the contacts 143 and 144 are connected to terminals 145 and 146 of the circuits 135 and 136 while in a continuous-delay position, as shown, they are connected to terminals 147 and 148. In a sample and hold position, contacts 143 and 144 are engaged with floating contacts 149 and 150. In this position, a pair of ganged push button switches 151 and 152 may be operated to closed sample or null positions to connect the output terminals 137 and 138 of the balance and storage circuits to terminals 153 and 154 thereof.

In this instrument, the outputs of the phase detectors 133 and 134 are at relatively low levels and the amplifiers 139 and 140 are high gain DC amplifiers, supplying DC signals for operation of the indicating circuit 142.

The operation will be best understood after considering the circuitry of the balance and storage circuit 135 and the amplifier 139, shown in FIG. 4, the circuitry of the circuits 136 and 140 being the same.

Referring to FIG. 4, the output of the phase detector 133 is applied to the plus input of an operational amplifier 156 which input is connected to a capacitor 157 to ground. The minus input of amplifier 156 is connected through a resistor 159 to the movable contact of a potentiometer 160 which is connected between positive and negative power supply terminals 161 and 162, and the minus input of amplifier 156 is also connected to the output thereof to a resistor 163 and a capacitor 164 in parallel. The output of amplifier 156 is connected to the output terminal 137 through a storage capacitor 166 and is also connected to the terminal 145. A resistor 167 is connected between terminals 147 and 153 and a resistor 168 is connected between terminal 153 and ground.

In the manual position of the selector switch, the contact 143 is connected to the terminal 145 and the storage capacitor 166 is short-circuited, the output of the amplifier 156 being applied directly to the input of the high gain DC amplifier 139. In the manual operation, potentiometer 160 and a corresponding potentiometer of the circuit 136 may be adjusted to obtain a null indication in a certain condition of the probe and reference coils 112 and 116.

In the continuous-delay position of the mode selector switch, contact 143 is connected to terminal 147 which is connected to ground through the resistors 167 and 168 in series. The capacitor 166 is then charged by any voltage appearing at the output of the amplifier 156 but with a delay dependent upon the values of the capacitor 166 and the resistors 167 and 168. By way of example, the capacitor 166 may have a value of 0.5 microfarads while the resistor 167 may have a value of 10 megohms and the resistor 168 may have a value of 10,000 ohms. With such values, the product of the capacitance and resistance is about five seconds and a delay time of substantially longer duration is required for the voltage at the output terminal 137 to become nearly equal to the voltage at the output of amplifier 156. Thus, by holding the probe coil 112 in a stable condition for a substantial length of time, a voltage is developed across the capacitor 166 nearly equal to the output voltage of the amplifier 156 and since the capacitor 166 is in series between the output of amplifier 156 and the input of amplifier 139, no net voltage is applied to the amplifier 139 and a null condition is established, it being understood that the operation of the balance and storage circuit 136 is the same with reference to the other error signal component. However, if the probe coil 112 is moved relative to a part to establish a different condition, to develop a different voltage at the output of amplifier 156 and/or the corresponding amplifier of the circuit 136, a change from the null indication will be indicated.

In either the continuous-delay position or the sample and hold position of the selector switch, the push button switch may be operated to connect terminals 153 and 154 to the output terminals 137 and 138. The capacitor 166 and the corresponding capacitor of circuit 136 may be then rapidly charged to voltages substantially equal to the output voltages of the amplifiers, the resistor 168 and the corresponding resistor circuit 136 having relatively low values of on the order of 10,000 ohms, for example. Thus, a balanced condition may be rapidly established by operation of the push button switch contacts. When such rapid balancing is effected, with the selector switch in the sample and hold condition, the storage capacitor 166 and the corresponding capacitor of circuit 136 remain charged indefinitely, there being no discharge path other than through stray leakage resistances or through the inputs of the amplifiers 139 and 140 which preferably have extremely high input impedances on the order of hundreds of megohms or higher.

In the illustrated circuit, amplifier 139 comprises an operational amplifier 170 having a plus input connected to the output terminal 137 of circuit 135 and having a minus input connected through a resistor 171 to ground and through a resistor 172 and a capacitor 173 in parallel to the output thereof. Terminals of the amplifier 170 are connected to opposite end terminals of a potentiometer 174 having a movable contact connected to a power supply terminal 175, potentiometer 174 and a corresponding potentiometer of the circuit 140 being adjustable to obtain a null indication with no input voltages applied to the amplifier circuits 139 and 140. The amplifier 170 may be a type CA 3130 and provides an extremely high input impedance so that in the sample and hold position of the mode selector switch, the charges of the storage capacitors may be held indefinitely.

In some applications, it is desirable to hold a balance condition for a time longer than is practically possible with capacitor storage even with amplifiers having extremely high input impedances. Reference numeral 178 in FIG. 5 generally designates a storage circuit which will hold an error signal as long as desired in any application. The storage circuit 178 comprises a high frequency clock source 179 connected through a push button switch 180 to a reversible digital counter 181 which is connected to a digital-analog coverter 182 having an output terminal 183 connected through a resistor 184 to ground, a voltage being established at terminal 183 corresponding to any count stored in the counter 181. Terminal 183 and an input terminal 185 are connected to inputs of a comparator circuit 186 having an output connected to the counter 181.

Figure 5:
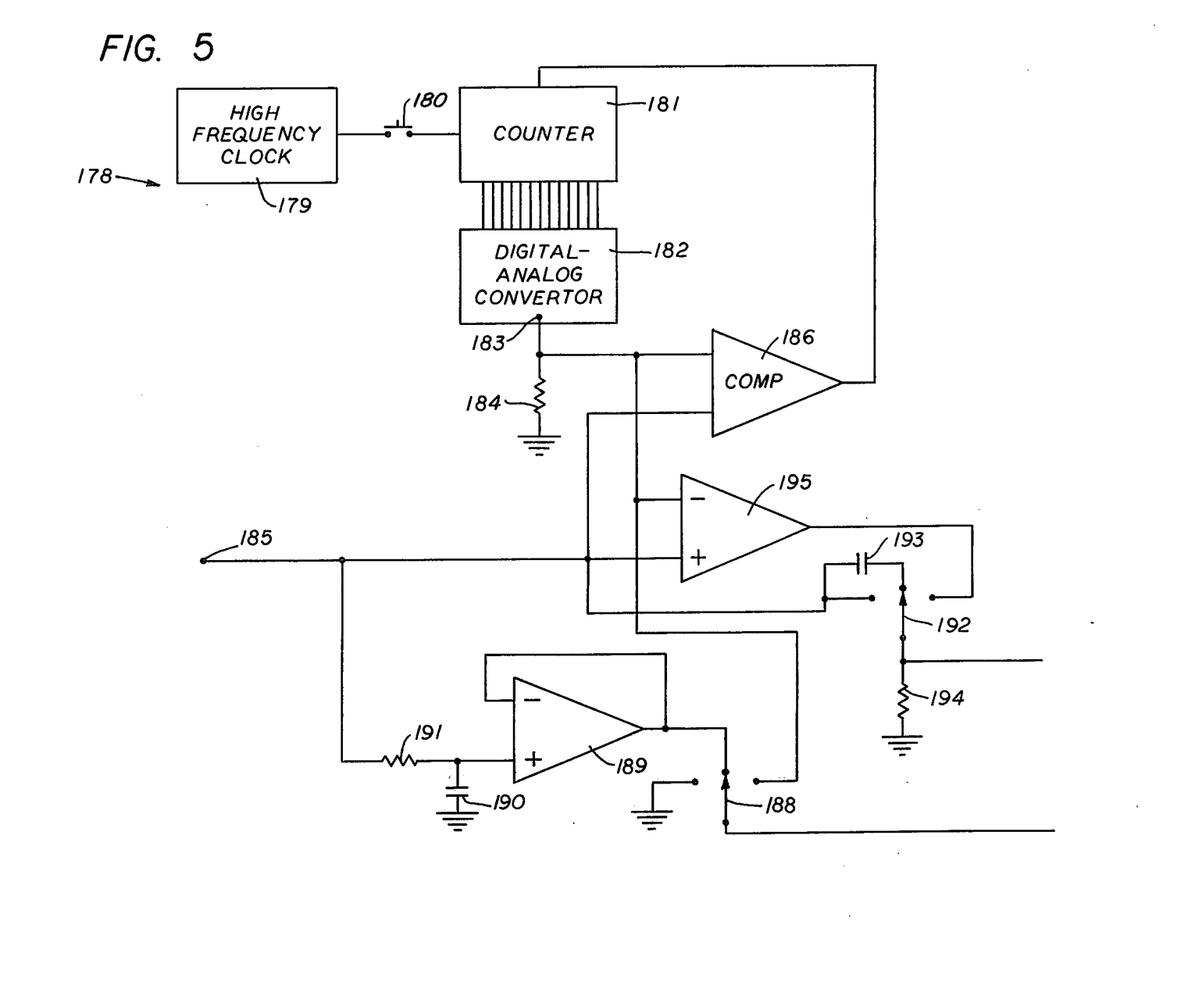
FIG. 5 is a schematic diagram of digital storage circuitry usable in either the system of FIGS. 1 and 2 or the system of FIGS. 3 and 4.

In operation, the switch 180 may be closed and the counter 181 will count clock pulses from the clock 179 in an increasing direction until the voltage at the output terminal 183 exceeds the input voltage at terminal 185 whereupon the direction of counting is reversed by a signal applied from the comparator circuit 186 to the counter 181. With a stable signal applied to the input terminal 185, the counter 181 will alternate between two states above and below that producing the exactly correct output signal from the digital-analog converter. With a changing signal applied, the counter 181 will track, increasing its count as the input increases and decreasing its count as the input decreases. In either case, the possible error is small and can be reduced to a minimal value by providing a sufficient number of stages in the counter 181.

For use in the system of FIG. 1, a selector switch may be provided having, for one component, a contact 188 connected to the input of one modulator and connectable to ground in a manual position. In a continuous-delay position, contact 188 is connected to the output of an amplifier 189 having an input connected through a storage capacitor 190 to ground and through a resistor 191 to the input terminal 185, terminal 185 being connected to the output of the phase detector 25. Resistor 191 and storage capacitor 190 operate to provide a delay in a manner as similar to the operation of resistor 75 and capacitor 77. In a sample and hold position, the contact 188 is connected to the output of the converter 182.

For use in the system of FIG. 3, a selector switch contact 192 is provided for connection to the input of amplifier 139, contact 192 being connected in a manual position to the input terminal 185 which may be connected to the output of the phase detector 133 or to the output of an isolation amplifier such as amplifier 156. In a continuous-delay position, contact 192 is connected through a storage capacitor 193 connected to the terminal 185, capacitor 193 operating in a manner similar to the capacitor 166, in conjunction with a resistor 194 which is connected between contact 192 and ground, the operation of resistor 194 being the same as that of resistors 167 and 168 in the continuous-delay operation. For the sample and hold operation, contact 192 is connected to the output of a differential amplifier 195 having inputs connected to the input terminal 185 and the converter output terminal 183. In the sample and hold operation, switch 180 and a corresponding switch for the other channel may be closed to store the error signals in the converter 182 and the converter of the other channel. After opening of the switches, the differential amplifier 195 and a corresponding amplifier for the other channel then operate to compare the input signals and the stored signals and apply the results to the amplifiers 139 and 140.

It will be understood that modifications and variations may be effected without departing from the spirit and scope of the novel concepts of the invention.

We claim as our invention:

1. In a non-destructive testing system comprising a probe circuit including probe means adapted to be placed in proximity to a part to develop an output signal according to characteristics of the part, indicating means, and signal processing means having input means coupled to said probe circuit to respond to said output signal thereof and having output means coupled to said indicating means, said signal processing means including circuit means responsive to at least a component of said probe circuit output signal to apply a corresponding drive signal to said indicating means, a predetermined value of said drive signal being operative to produce a reference null indication by said indicating means, said circuit means including automatic balancing means for maintaining said drive signal at an average value equal to said predetermined value irrespective of relatively slow changes in the average value of said probe circuit output signal component while allowing changes in said drive signal in response to rapid changes in said probe circuit output signal component, said circuit means further including sample and hold means including a switch manually operable between a sample position and a hold position, sample means operative in said sample position of said switch to develop a voltage corresponding to the existing value of said probe circuit output signal component, and hold means operative upon operation of said switch from said sample position to said hold position to store said voltage and to apply said stored voltage in said signal processing means in a direction to oppose said probe circuit output signal component and to produce said predetermined value of said drive signal and said reference null indication when said probe circuit output signal component has a value equal to said existing value, mode selector switch means manually operable between an automatic balance position and a sample and hold position, means operative in said automatic balance position for rendering said automatic balancing means operable and said sample and hold means inoperable, and means operative in said sample and hold position for rendering said sample and hold means operable and said automatic balancing means inoperable.

2. In a system as defined in claim 1, said automatic balance means comprising capacitance means and means including resistance means having a relatively high value for relatively slowly charging and discharging said capacitance means in response to slow changes in the value of said probe circuit output signal component, and means for applying a voltage from said capacitance means in said signal processing means in a direction to oppose variations in the value of said drive signal away from said predetermined value.

3. In a system as defined in claim 2, said hold means comprising digital storage means.

4. In a system as defined in claim 3, said digital storage means comprising reversible digital counter means, high frequency clock means, means coupling said high frequency clock means to said digital counter means in said sample position of said sample and hold switch, digital-analog converter means coupled to said counter means to produce an analog signal corresponding to the count of said counter means, and signal comparison means responsive to a signal corresponding to said probe circuit output signal component and to the analog output signal of said converter means and connected to said counter means to cause said counter means to count in an increasing direction when the magnitude of said signal is greater than the analog output of said converter means and in a decreasing direction when the magnitude of said signal is less than the analog output of said converter means.

5. In a system as defined in claim 2, said sample and hold means comprising said capacitance means, said sample means being operative in said sample position of said switch for developing said voltage across said capacitance means corresponding to the existing value of said probe circuit output signal component, and said hold means comprising means for preventing change in the charge of said capacitance means in said hold position of said switch.

6. In a system as defined in claim 5, said circuit means including amplifier means having a high impedance input and having an output connected through said resistance means to said capacitance means, second capacitance means connected to said high impedance input, and switch means operative in said automatic balance position of said mode selector switch means and also during coincident operation of said mode selector switch means to said sample and hold position and said sample and hold switch means to said sample position to apply a voltage to said high impedance input and said second capacitance means corresponding to said probe circuit output signal component.

7. In a system as defined in claim 5, said circuit means comprising means for applying a signal corresponding to said probe circuit output signal component to one terminal of said capacitance means, means coupled to an opposite terminal of said capacitance means to develop said drive signal, a ground terminal, a first resistor connected to one end to said ground terminal, a second resistor connected at one end to an opposite end of said first resistor, said sample and hold means switch being connected between said opposite end of said first resistor and said opposite terminal of said capacitor means and being closed in said sample position and open in said hold position, and said mode selector switch means including a contact connected between the opposite end of said second resistor and said opposite terminal of said capacitance means, said contact being closed in said automatic balance position and being open in said sample and hold position.

8. In a system as defined in claim 7, an amplifier having a high impedance input connected to said opposite terminal of said capacitor means and forming said means for developing said drive signal, said first resistor having a relatively low value and said second resistor having a value relatively large in relation to that of said first resistor and relatively low in relation to the input impedance of said amplifier means.

9. In a system as defined in claim 1, said signal processing means being arranged to develop a pair of signal components from said probe circuit output signal in quadrature phase relation and including a pair of circuit means each including automatic balancing and sample and hold means as defined in claim 20 for developing a pair of drive signals, said mode selector switch means being arranged to conjointly control both of said circuit means.

10. In a system as defined in claim 1, manual balance control means for controlling said circuit means to control the relationship between said probe circuit output signal component and said drive signal, said mode selector switch means being operable to a manual balance position, and means operable in said manual balance position for rendering both said automatic balance means and said sample and hold means inoperative for control solely from said manual balance control means.

* * * * *